(12) United States Patent
Lee et al.

(10) Patent No.: US 10,497,604 B2
(45) Date of Patent: Dec. 3, 2019

(54) PHOTOMASK TRANSPORTATION STAGE IN SEMICONDUCTOR FABRICATION AND METHOD FOR USING THE SAME

(71) Applicant: Taiwan Semiconductor Manufacturing Co., Ltd., Hsinchu (TW)

(72) Inventors: Yu-Ching Lee, Kaohsiung (TW); Yu-Piao Fang, Tainan (TW); Yu-Wei Liao, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 286 days.

(21) Appl. No.: 15/587,540

(22) Filed: May 5, 2017

(65) Prior Publication Data

US 2018/0287583 A1 Oct. 4, 2018

Related U.S. Application Data

(60) Provisional application No. 62/478,668, filed on Mar. 30, 2017.

(51) Int. Cl.
| | |
|---|---|
| *H01L 21/677* | (2006.01) |
| *H01L 21/683* | (2006.01) |
| *G01L 9/00* | (2006.01) |

(52) U.S. Cl.
CPC ........ *H01L 21/6838* (2013.01); *G01L 9/0025* (2013.01)

(58) Field of Classification Search
CPC .................... H01L 21/6838; G01L 9/0025
See application file for complete search history.

(56) References Cited

U.S. PATENT DOCUMENTS

| | | | | |
|---|---|---|---|---|
| 4,394,060 | A * | 7/1983 | Verber | G02B 6/12004 324/76.36 |
| 5,796,882 | A * | 8/1998 | Schmid | G02F 1/125 385/11 |
| 6,477,898 | B1 * | 11/2002 | Han | G01N 29/12 73/579 |
| 6,834,548 | B1 * | 12/2004 | Hibbs | G01N 29/11 73/579 |
| 8,764,995 | B2 | 7/2014 | Chang et al. | |
| 8,796,666 | B1 | 8/2014 | Huang et al. | |
| 8,828,625 | B2 | 9/2014 | Lu et al. | |
| 8,841,047 | B2 | 9/2014 | Yu et al. | |
| 8,877,409 | B2 | 11/2014 | Hsu et al. | |
| 9,093,530 | B2 | 7/2015 | Huang et al. | |
| 9,184,054 | B1 | 11/2015 | Huang et al. | |
| 9,256,123 | B2 | 2/2016 | Shih et al. | |

(Continued)

*Primary Examiner* — Michael S Lowe

(74) *Attorney, Agent, or Firm* — McClure, Qualey & Rodack, LLP

(57) ABSTRACT

A transportation stage for transporting a photomask is provided. The transportation stage includes a vacuum source and a supporting plate. The supporting plate has a number of passages connected to the vacuum source. The transportation stage further includes a membrane positioned on the supporting plate. A number of through holes are formed on a middle region of the membrane and communicating with the passages. The transportation stage also includes an acoustic wave transducer positioned on the membrane and is configured generate an acoustic wave along the membrane.

20 Claims, 13 Drawing Sheets

(56) References Cited

U.S. PATENT DOCUMENTS

| | | |
|---|---|---|
| 9,529,268 B2 | 12/2016 | Chang et al. |
| 9,548,303 B2 | 1/2017 | Lee et al. |
| 2006/0061747 A1* | 3/2006 | Ishii .................... G03F 7/70341 355/53 |
| 2007/0113658 A1* | 5/2007 | Combi .................. G01L 9/0025 73/702 |
| 2011/0014577 A1* | 1/2011 | Hashimoto ............ G01N 21/94 430/325 |

* cited by examiner

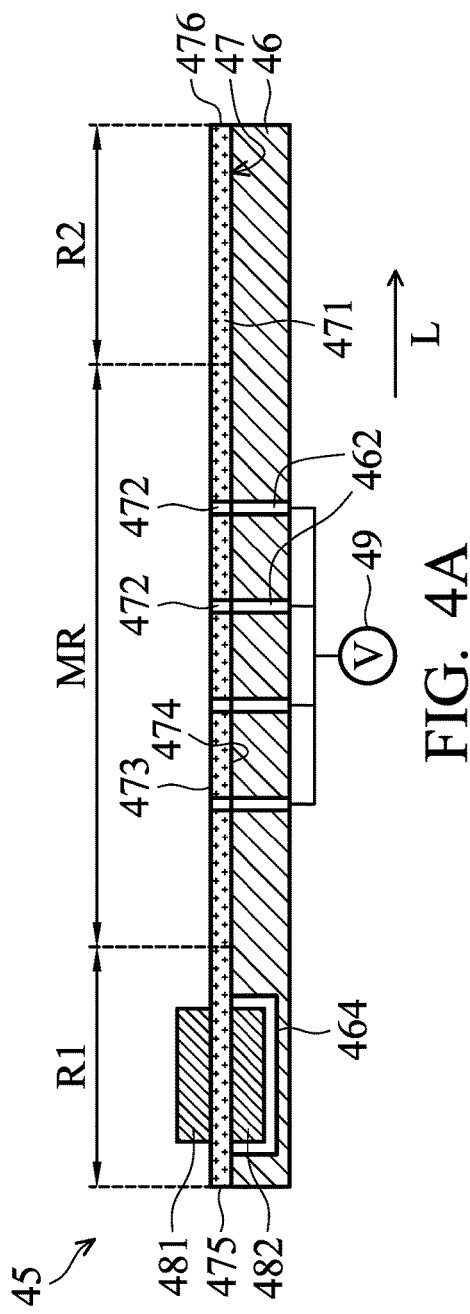
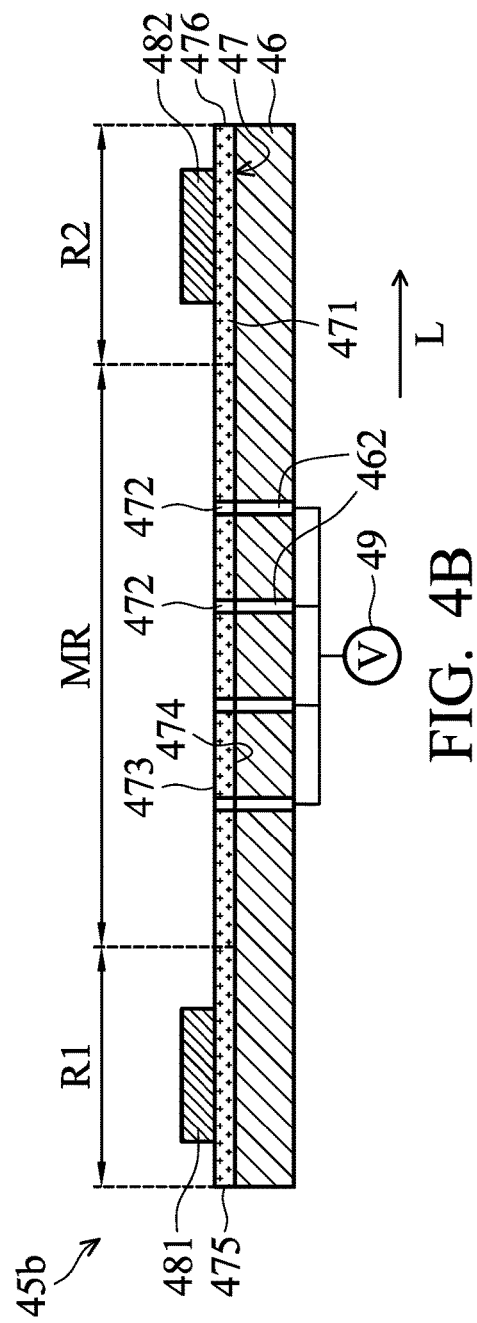

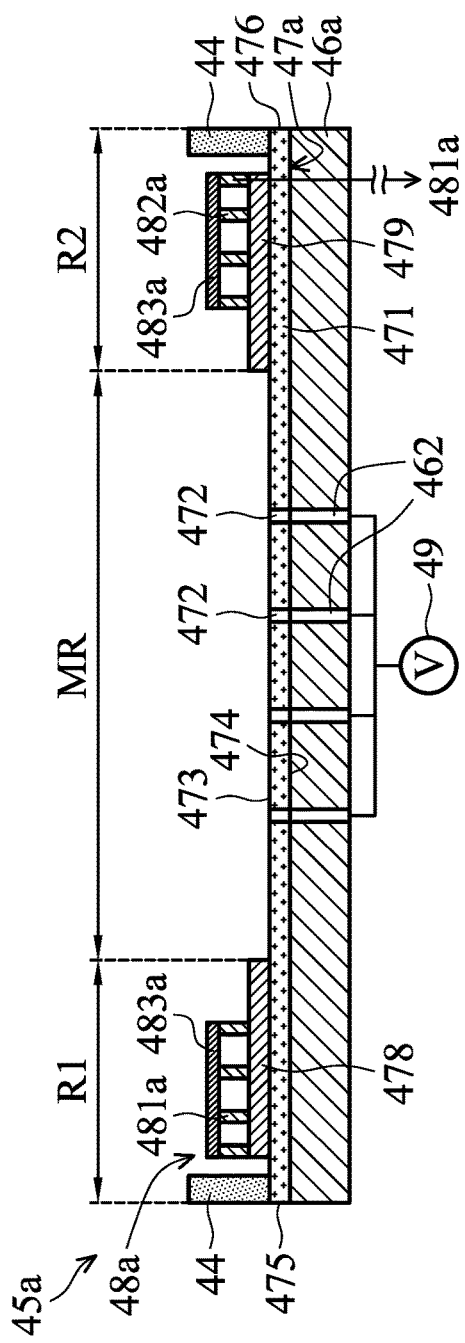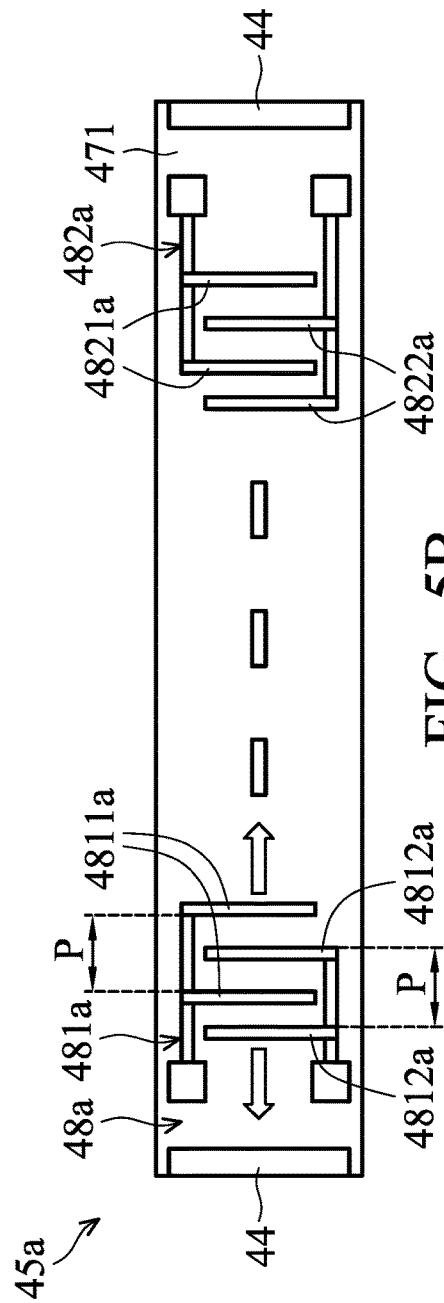
FIG. 5A
FIG. 5B

PHOTOMASK TRANSPORTATION STAGE IN SEMICONDUCTOR FABRICATION AND METHOD FOR USING THE SAME

PRIORITY CLAIM AND CROSS-REFERENCE

This application claims the benefit of U.S. Provisional Application No. 62/478,668, filed on Mar. 30, 2017, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor wafer, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allows more components to be integrated into a given area. These smaller electronic components also require smaller packages that utilize less area than the packages of the past, in some applications.

During the manufacturing of the semiconductor devices, various processing steps are used to fabricate integrated circuits on a semiconductor wafer.

As semiconductor technologies evolve, advanced lithography techniques have been widely used in today's integrated circuit fabrication processes. Photolithographic techniques involves forming a photoresist layer over a substrate, exposing portions of the photoresist material to a pattern of light in accordance with a desired pattern, developing the photoresist material to remove portions of the photoresist material to expose portions of the underlying material. A suitable etching process such as dry etching, wet etching and/or the like may then be performed on the substrate. As a result, the exposed underlying material may be removed in accordance with the desired pattern.

The exposure step of the lithography process may involve a variety of reticles (a.k.a. photomasks). The lithography process of the integrated circuit may comprise multiple photolithography process steps due to the complexity of the manufacturing process. Each lithography step may employ a reticle through which the pattern of a component of an integrated circuit is generated.

An integrated circuit fab may comprise a variety of lithography apparatuses such as steppers, immersion scanners and the like. In addition, the fab may have a plurality of stockers for storing wafers and reticles. The factory is automated by using automatic guided vehicles to transport wafers and reticles and using robots to load wafers and reticles into lithography apparatuses.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 4A is a cross-sectional view of a clamping device, in accordance with some embodiments.

FIG. 4B is a cross-sectional view of a clamping device, in accordance with some embodiments.

FIG. 5A is a cross-sectional view of a clamping device, in accordance with some embodiments.

FIG. 5B is a top view of a clamping device, in accordance with some embodiments.

DETAILED DESCRIPTION

Figure 1:
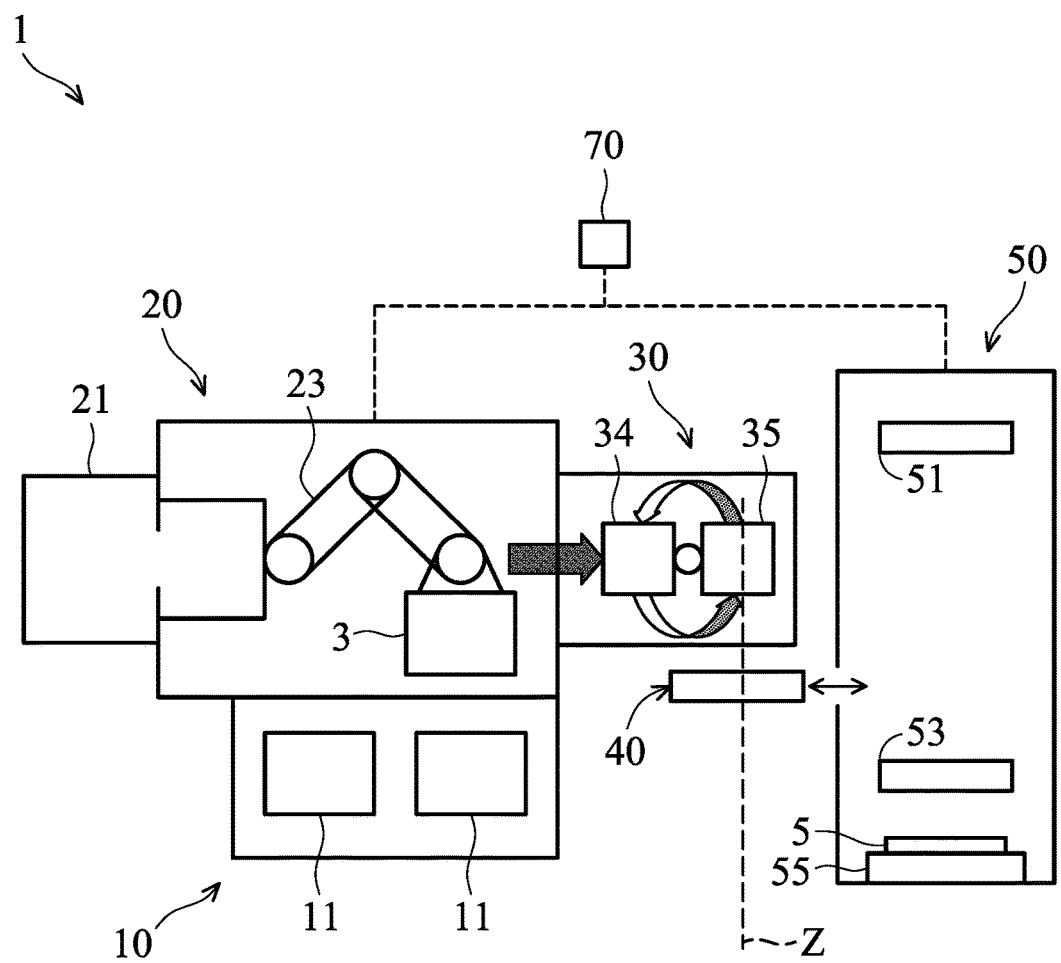
FIG. 1 is cross-sectional view of a semiconductor wafer processing system, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and the second features are formed in direct contact, and may also include embodiments in which additional features may be formed between the first and the second features, such that the first and the second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 shows a schematic view of a transportation system 1, in accordance with some embodiments. In some embodiments, the transportation system 1 includes a load port 10, a transferring module 20, a switching module 30, a transportation stage 40 and a processing module 50. The elements of the transportation system 1 can be added to or omitted, and the invention should not be limited by the embodiment.

In some embodiments, the load port 10 is configured to load a photomask 3 from a carrier 11 to the transportation system 1 or remove a photomask 3 from the transportation system 1 to the carrier 11. In some embodiments, the load port 10 is able to place two carriers 11. One of the two carriers 11 is used to carry the photomask 3 which are going to be transported into the transportation system 1, and another one is used to carry the photomask 3 which are removed from the transportation system 1.

The transferring module 20 is configured to deliver the photomask 3 between the load port 10 and the switching module 30. In some embodiments, the transferring module 20 is positioned between the load port 10 and the switching module 30. The transferring module 20 may include a control circuit 21 and a robotic arm 23. The robotic arm 23 is controlled by the electric signal outputted from the control circuit 21. The robotic arm 23 may include a six-axis robot manipulator and is configured for grapping the photomask 3.

Figure 2:
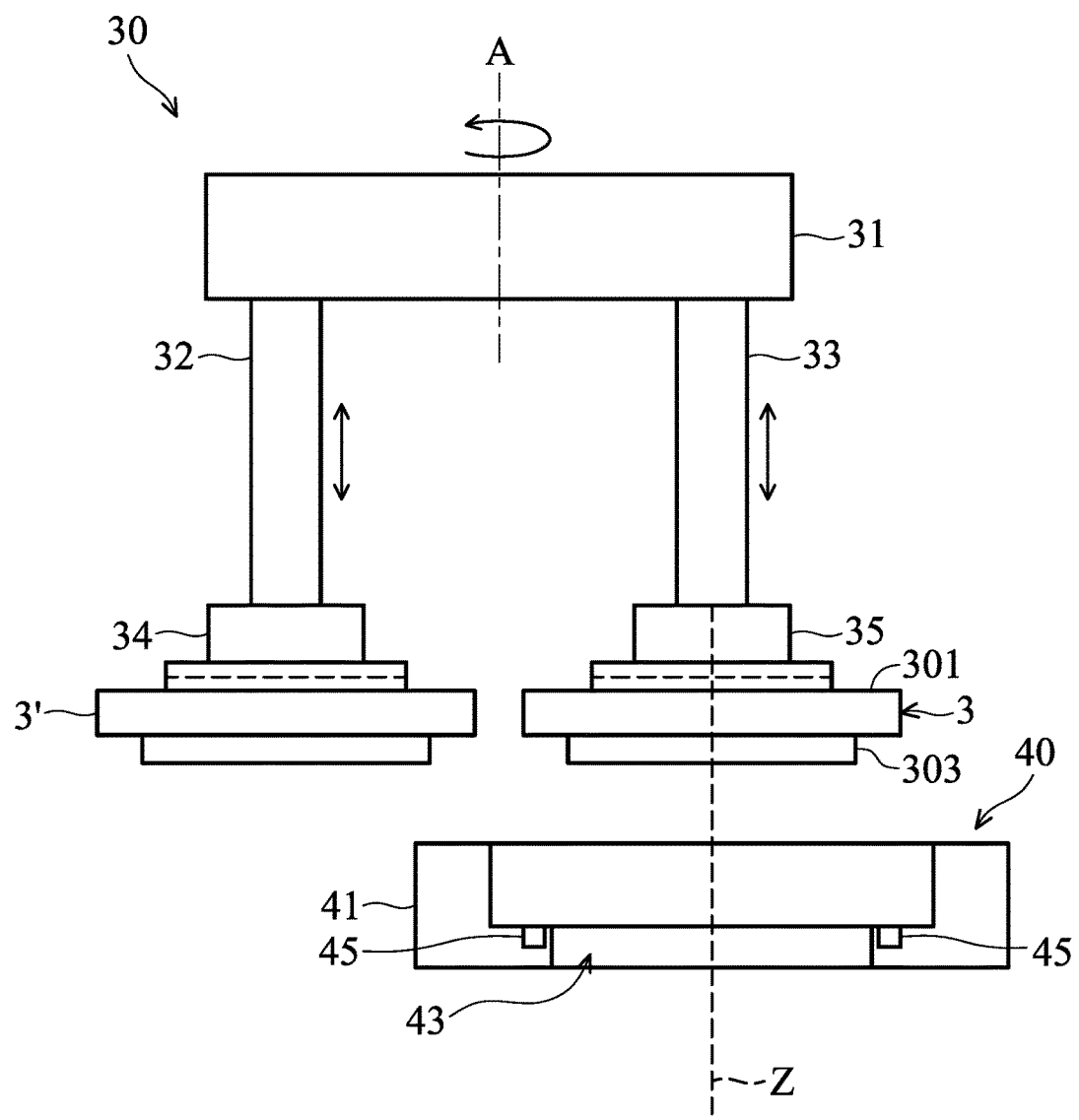
FIG. 2 is a partial schematic view of a semiconductor wafer processing system, in accordance with some embodiments.

The switching module 30 is configured for grapping the photomask 3 before the photomask 3 is moved to the transportation stage 40 and after the photomask 3 is removed from the transportation stage 40. In some embodiments, as shown in FIG. 2, the switching module 30 includes a base 31, two elevators 32 and 33 and two carrier heads 34 and 35. The two elevators 32 and 33 are connected to the bottom surface of the base 31. The two carrier heads 34 and 35 are respectively connected to two ends of the two elevators 32 and 33. The base 31 is arranged to be moved around the rotation axis A, and each of the two elevators 32 and 33 is able to independently move in a vertical direction relative to the base 31 as indicated by the arrow shown in FIG. 2. The two carrier heads 34 and 35 are configured to grip the photomask 3 by suitable means. For example, the two carrier heads 34 and 35 are connected to a vacuum source, and the photomask 3 are mounted on the bottom surfaces of the two carrier heads 34 and 35 by the vacuum. However, it should be appreciated that many variations and modifications can be made to embodiments of the disclosure.

Figure 3:
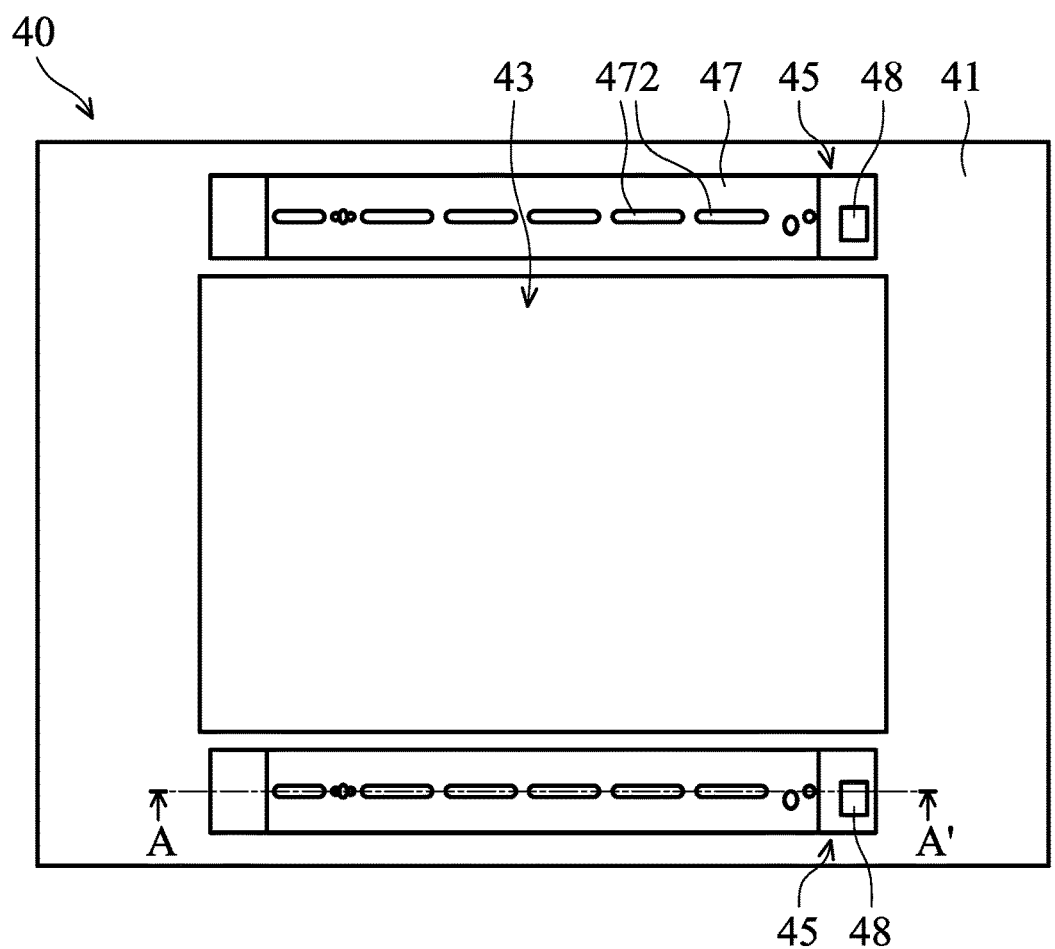
FIG. 3 is a top view of a transportation stage, in accordance with some embodiments.
Figure 9:
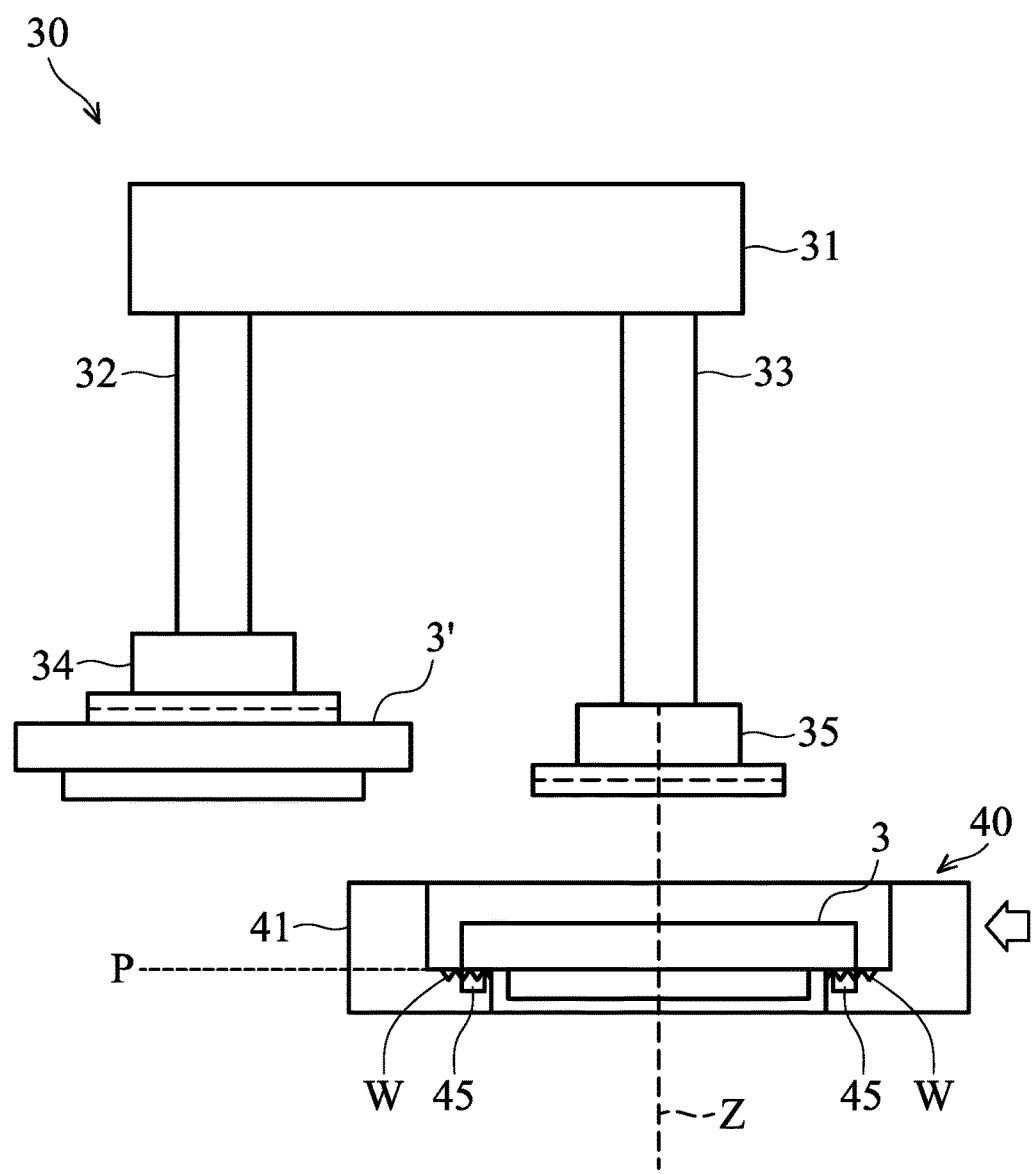
FIG. 9 is a schematic view of one stage of a process for transporting a photomask in a semiconductor wafer processing system as the transportation stage is in a processing position, in accordance with some embodiments.

FIG. 3 shows a top view of the transportation stage 40, in accordance with some embodiments. In some embodiments, the photomask 3 is transferred by the transportation stage 40 between a loading position (FIG. 7) and a processing position (FIG. 9).

In some embodiments, the transportation stage 40 is used for conveying the photomask 3 in ultraviolet (UV) or deep ultraviolet (DUV) lithography. The transportation stage 40 includes a main body 41 and two clamping devices 45. The main body 41 is penetrated by an opening 43. The dimension of the opening 43 may be modified according the size of the photomask 3 which is going to be conveyed. In some embodiments, the two clamping devices 45 are positioned at two opposite sides of the opening 43. However, it should be appreciated that many variations and modifications can be made to embodiments of the disclosure.

In some embodiments, the transportation stage 40 is used for conveying the photomask 3 in EUV lithography. The opening 43 is omitted, and there are two or more than two clamping devices 45 positioned at the contacting surface of the main body 41 which is in contact with a backside surface of the photomask 3.

The structural features, in accordance with some embodiments, of the claiming devices 45 are described below.

FIG. 4A shows a schematic cross-sectional view of the claiming devices 45 taken along line A-A' of FIG. 3. In some embodiments, the clamping device 45 includes a supporting plate 46, a membrane 47, one or more acoustic transducers, such as first acoustic transducer 481 and second acoustic transducer 482, and a vacuum source 49. The elements of the clamping device 45 can be added to or omitted, and the invention should not be limited by the embodiment.

In some embodiments, the supporting plate 46 has a thickness and includes a number of passages 462 formed therein. The passages 462 fluidly communicate with the vacuum source 49. A valve may be disposed on the gas line that connects the vacuum source 49 to the passages 462 to facilitate the control of the vacuum in the passages 462. In some embodiments, the supporting plate 46 further includes a recess 464 for receiving the acoustic transducer.

In some embodiments, the membrane 47 is positioned on the supporting plate 46 and includes a base layer 471 extending from a first end 475 along a longitudinal direction L of the membrane 47 and terminates at a second end 476. The first end 475 and the second end 476 are two opposite ends of the membrane 47 in its longitudinal direction L. The membrane 47 may be made of silica glass or piezoelectric materials.

For the purpose of illustration, as shown in FIG. 4A, the membrane 47 is divided into three regions, i.e., a first end region R1, a middle region MR and a second end region R2 consecutively arranged in the longitudinal direction L of the membrane 47. It should be noted that, in the embodiments shown in FIG. 3, the first end region R1, the middle region MR and the second end region R2 are integrally formed and no gap is formed between them.

In some embodiments, the first end region R1 is arranged adjacent to the first end 475, and the second end region R2 is arranged adjacent to the second end 476. The middle region MR connects the first end region R1 to the second end region R2. The boundary line of the first end region R1 and the middle region MR may be spaced from the first end 475 by a distance which is different from a distance between the boundary line of the second end region R2 and the middle region MR.

Alternatively, the boundary line of the first end region R1 and the middle region MR may be spaced from the first end 475 by a distance that is the same as a distance from the between the boundary line of the second end region R2 and the middle region MR. The length of the first end region R1 and the second end region R2 may vary according to the dimensions of the acoustic transducer which is described below.

In some embodiments, the middle region MR has a length that is substantially equal to the length of an edge of the photomask 3 that is parallel to the longitudinal direction L of the membrane 47. However, it should be appreciated that many variations and modifications can be made to embodiments of the disclosure. The length of the middle region MR may be greater than or less than the length of an edge of the photomask 3.

As shown in FIG. 4A, a number of through holes 472 are formed relative to the middle portion MR of the membrane 47. The through holes 472 penetrate the front surface 473 and the rear surface 474 of the membrane 47. The through holes 472 communicate the passages 462 in the supporting plate 46. In some embodiments, there are the same number of through holes 472 as there are passages 462 formed in the supporting plate 46. The spaces between the through holes 472 may be the same or different.

In some embodiments, the through holes 472 are located between the boundary lines of the first end region R1 and the second end region R2 of the membrane 47, and there is no through hole formed in the first end region R1 and the second end region R2 of the membrane 47. The through holes 472 may be arranged along the longitudinal direction L of the membrane 47. In some other embodiments, the through holes 472 are arranged in two rows in a direction that is parallel to the longitudinal direction L.

The first acoustic transducer 481 and the second acoustic transducer 482 are configured to impart acoustic waves, such as Lamb waves, in the membrane 47. In some embodiments, the first acoustic transducer 481 and the second acoustic transducer 482 are both positioned at the first end region R1 of the membrane 47. In addition, the first acoustic transducer 481 faces the front surface 473 of the membrane 47 and the second acoustic transducer 482 faces the rear surface 474 of the membrane 47.

For example, as shown in FIG. 4A, the first acoustic transducer 481 and the second acoustic transducer 482 are both positioned at the first end region R1 of the membrane 47. In addition, the first acoustic transducer 481 is in direct contact with the front surface 473 of the membrane 47, and the second acoustic transducer 482 is in direct contact with the rear surface 474 of the membrane 47. However, it should be appreciated that many variations and modifications can be made to embodiments of the disclosure.

In some other exemplary embodiments, the first acoustic transducer 481 and the second acoustic transducer 482 are both positioned at the first end region R1 of the membrane 47 in direct contact with the membrane 47. Each of the first acoustic transducer 481 and the second acoustic transducer 482 may include vibration electrode plates (not shown) mounted on the membrane 47. The vibration electrode plates vibrate in a manner to impart a Lamb wave into the membrane 47.

It should be noted that the operation principle and the arrangements of the first acoustic transducer 481 and the second acoustic transducer 482 should not be limited to the embodiments shown in FIG. 4A. Many variations and modifications to embodiments of the disclosure are described below.

FIG. 4B is a cross-sectional view of a clamping device 45b, in accordance with some embodiments. The difference between the clamping device 45b and the clamping device 45 is that the second acoustic transducer 482 is mounted on the second region of the membrane 47.

Specifically, the first acoustic transducer 481 and the second acoustic transducer 482 are both facing the front surface 473 of the membrane 47. The first acoustic transducer 481 is positioned at the first end region R1 of the membrane 47, and the second acoustic transducer 482 is positioned at the second end region R2 of the membrane 47. In operation, the acoustic waves generated by the first acoustic transducer 481 and the second acoustic transducer 482 may be synchronized in the middle portion MR of the membrane 47 so as increase the amplitude.

The wave forms, in accordance with some embodiments, can be determined by the following equations (1) and (2):

$$\phi = \{A1 \exp(jk_l z) + A2 \exp(-jk_l z)\} \exp(j\omega t - \beta x) \quad (1)$$

$$\psi = \{A3 \exp(jk_s z) + A4 \exp(-jk_s z)\} \exp(j\omega t - \beta x) \quad (2)$$

where Ai are amplitudes, $k_l$ and $k_s$ are wave numbers for the longitudinal and shear modes, $\beta$ is the wave number of the propagating mode.

In some embodiments, the membrane 47 is a free plate with a thickness of about 0.2 mm, and thus the shear stress $T_{xz}$ and the normal stress $T_{zz}$ of the membrane 47 are both equal to 0. The shear stress $T_{xz}$ on the membrane 47 satisfies equation (3), and the normal stress $T_{zz}$ satisfies equation (4):

$$T_{xz} = \mu\left(\frac{\partial^2 \phi}{\partial x \partial z}\right) + \mu\left(\frac{\partial^2 \psi}{\partial z^2}\right) - \mu\left(\frac{\partial^2 \psi}{\partial x^2}\right) \quad (3)$$

$$T_{zz} = (\lambda + \mu)\left(\frac{\partial^2 \phi}{\partial x^2} + \frac{\partial^2 \phi}{\partial z^2}\right) - 2\mu\left(\frac{\partial^2 \phi}{\partial x^2} + \frac{\partial^2 \psi}{\partial x \partial z}\right) \quad (4)$$

Therefore, by substituting equation (3) and (4) into equation (1) and (2), the phase velocities of the Lamb waves generated by the acoustic transducers 481 and 482 in each particular mode can be calculated.

In some embodiments, a zero mode asymmetric Lamb wave (A0) and a zero mode symmetric Lamb wave (S0) are excited in all frequencies of the acoustic waves. A first mode asymmetric Lamb wave (A1) is excited when the frequency of the acoustic waves is greater than about 2 MHz, and a first mode symmetric Lamb wave (S1) is excited when frequency of the acoustic waves is greater than about 2.6 MHz. A second mode asymmetric Lamb wave (A2) is excited when the frequency of the acoustic waves is greater than about 4.2 MHz, and a second mode symmetric Lamb wave (S2) is excited when frequency of the acoustic waves is greater than about 4.8 MHz.

FIG. 5A is a cross-sectional view of a clamping device 45a, and FIG. 5B is a top view of the clamping device 45a, in accordance with some other embodiments. The clamping device 45a includes a supporting plate 46a, a membrane 47a, one or more acoustic transducers, such as first acoustic transducer 481a and the second acoustic transducer 482a, and a vacuum source 49. The elements of the clamping device 45a can be added to or omitted, and the invention should not be limited by the embodiment. The configuration of the supporting plate 46a and the membrane 47a are similar to that shown in FIG. 4A; however, the recess 464 of the supporting plate 46 is omitted.

In some embodiments, the first acoustic transducer 481a and the second acoustic transducer 482a are respectively positioned on the first end region R1 and the second end region R2 of the membrane 47a via coupling materials 478 and 479. In some embodiments, as shown in FIG. 5B, each of the first acoustic transducer 481a and the second acoustic transducer 482a includes two interlocking comb-shaped arrays of metallic electrodes (in the fashion of a zipper) which are patterned on two piezoelectric substrates 483a on the top.

The space P (the pitch) between two neighboring metallic electrodes on the same side is the wavelength of the acoustic wave. For example, there is a space P between the two neighboring metallic electrodes 4811a and 4812a, and there is a space P between the two neighboring metallic electrodes 4821a and 4822a. The frequency $f_0$ of the first acoustic transducer 481a and the second acoustic transducer 482a may satisfy the following equation:

$$f_0 = \frac{v_p}{p}$$

where the $V_p$ is the phase velocity and P is the space between the two neighboring metallic electrodes.

In some exemplary embodiments, the first acoustic transducer 481a is connected to a control circuit (not shown), and the second acoustic transducer 482a is electrically connected to the first acoustic transducer 481a via a feedback circuit. The first acoustic transducer 481a generates acoustic waves in response to electric signals form the control circuit. The second acoustic transducer 482a converts the acoustic waves from the first acoustic transducer 481a to electric signals and passes it to the first acoustic transducer 481a via the feedback circuit, arranged such that the energy is reused to generate acoustic waves again. However, it should be appreciated that many variations and modifications can be made to embodiments of the disclosure.

In some other embodiments, the first acoustic transducer 481a is connected to a control circuit (not shown), and the second acoustic transducer 482a is connected to ground. The first acoustic transducer 481a generates acoustic waves in response to electric signals form the control circuit, and the second acoustic transducer 482a converts the acoustic waves from the first acoustic transducer 481a to electric signals and passes it to ground.

In some embodiments, the two coupling materials 478 and the two piezoelectric substrates 483a are omitted, and the first acoustic transducer 481a and the second acoustic transducer 482a are patterned on the base layer 471. The base layer 471 is made of piezoelectric material, such as crystal, ceramic, and polymer material. Alternatively, the base layer 471 may be made of other material such as polymer material such as quartz (SiO2), Zirconium Titanate, BaTiO3, ceramic, and Polyvinylidene Fluoride.

In some embodiments, the clamping device 45a further includes one or more absorber 44. The absorbers 44 may be positioned at the edges of the membrane 47 to absorb acoustic waves propagating on the front surface of the membrane 47. For example, two absorbers 44 are positioned at the first end 475 and the second end 476 of the membrane 47. As a result, the acoustic waves propagating on the front surface of the membrane 47 can be absorbed so as to mitigate the oscillation occurring to other elements on the transportation stage 40 or to the photomask 3 positioned on the transportation stage 40. The absorbers 44 may be made of sponge rubber.

Referring back to FIG. 1, the processing module 50 is configured to process a semiconductor wafer 5 by the use of the photomask 3. In some embodiments, the processing module 50 is a lithography system. The processing module 50 includes a light source 51, a lens assembly 53 and a wafer chuck 55 for holding the semiconductor wafer 5.

In some embodiments, the processing module 50 pertains to extreme ultraviolet (EUV) lithography. The light source includes a radiation source providing light having a wavelength of about 13.5 nm. The photomask 3 may include a substrate 301 (shown in FIG. 2) having a number of light-reflective layers and absorbers formed on the light-reflective layers. EUV light is reflected from the light-reflective layers and absorbed by the absorbers so as to carry an image of the patterns defined by the substrate 301. However, it should be appreciated that many variations and modifications can be made to embodiments of the disclosure.

In some embodiments, the processing module 50 pertains to UV or deep ultraviolet (DUV) lithography. The light source includes a radiation source providing light having a wavelength in a range from UV to DUV. For example, a mercury lamp provides UV wavelength, such as G-line (436 nm) or I-line (365 nm), or an excimer laser provides DUV wavelength, such as 248 nm, 193 nm, or 157 nm. The photomask 3 may include a transparent fused silica substrate 301 covered with a pattern defined with a chrome metal-absorbing film. The substrate 301 blocks a portion of the light from the light source and provides an aerial image of the light so as to carry an image of the pattern defined by the substrate 301.

In some embodiments, the photomask 3 further includes a pellicle 303 (shown in FIG. 2) used to protect the substrate 301. The pellicle 303 includes a transparent thin membrane and a pellicle frame, where the membrane is mounted over a pellicle frame. The pellicle 303 protects the substrate 301 from fallen particles and keeps the particles out of focus so that they do not produce a patterned image, which may cause defects when the mask is being used. The membrane is typically stretched and mounted over the pellicle frame, and is attached to the pellicle frame by glue or other adhesives. An internal space may be formed by the mask, the membrane, and the pellicle frame.

The semiconductor wafer 5 may be made of silicon or another semiconductor material. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) semiconductor wafer.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The control module 70 is configured for controlling the operation of devices of the transportation system 1. In some embodiments, the control module 70 is a computer that communicates with the variant devices of the transportation system 1 by a wired or wireless communication network. For example, the control module 70 is electrically connected to the switching module 30 and the transportation stage 40. The operation of the switching module 30 and the transportation stage 40 is controlled by the control module 70.

Figure 6:
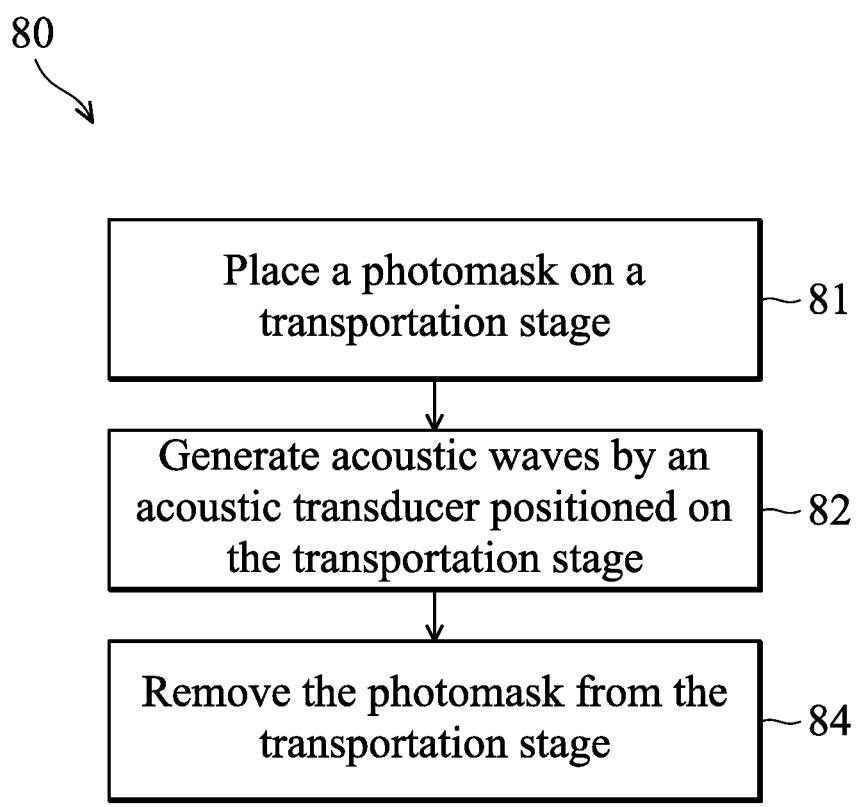
FIG. 6 is a flow chart of methods for processing a semiconductor wafer, in accordance with some embodiments

FIG. 6 is a flow chart illustrating a method 80 for processing a substrate, in accordance with some embodiments. For illustration, the flow chart will be described along with the drawings shown in FIGS. 7-12, which show schematic views of the transportation system 1. Some of the described transportation stages can be replaced or eliminated in different embodiments. Additional features can be added to the semiconductor device structure. Some of the features described below can be replaced or eliminated in different embodiments.

Figure 7:
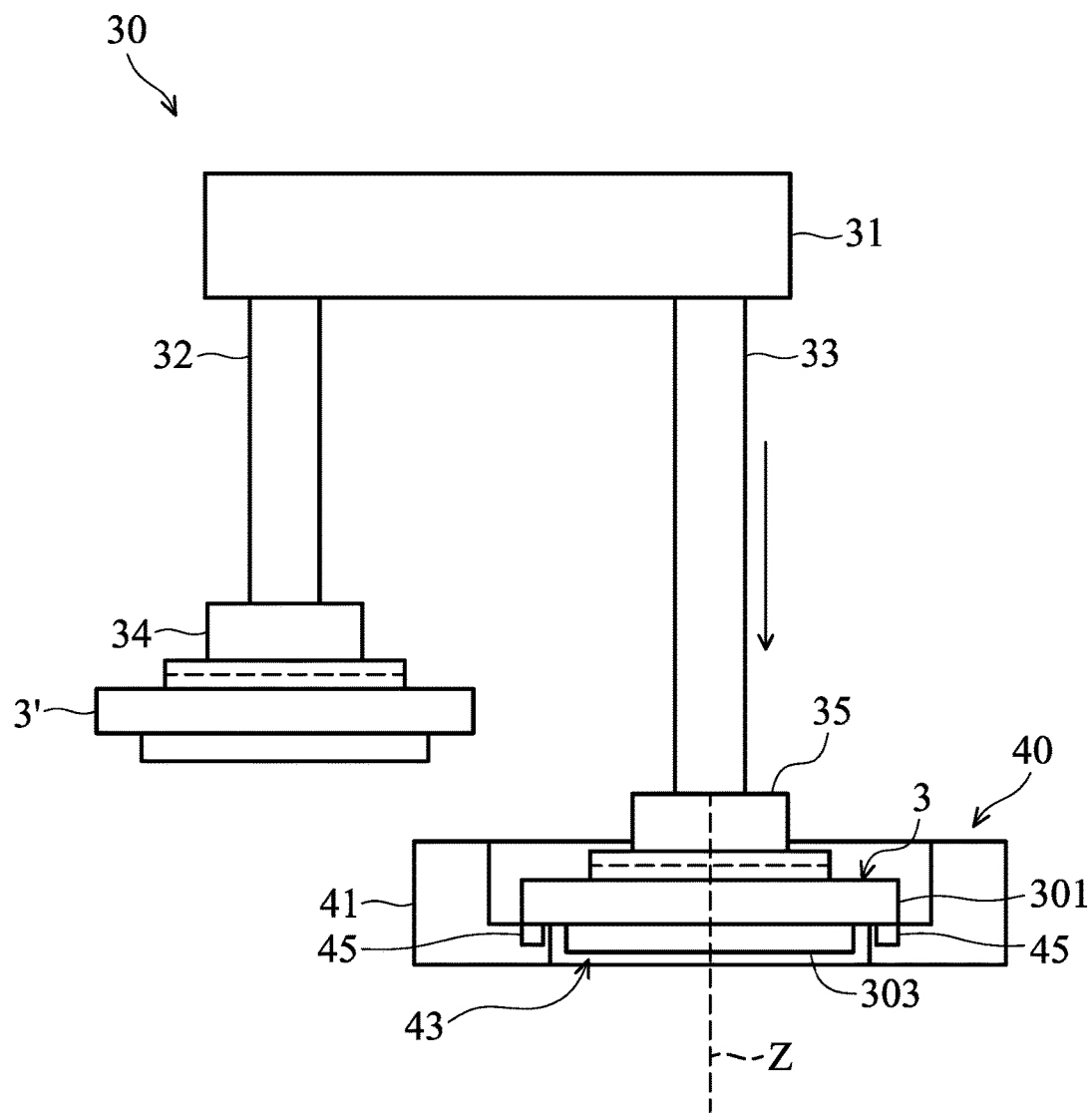
FIG. 7 is a schematic view of one stage of a process for transporting a photomask in a semiconductor wafer processing system as a transportation stage is in a loading position, in accordance with some embodiments.

The method begins with operation 81, in which the photomask 3 is placed on the transportation stage 40 by the use of the switching module 30. In some embodiments, in order to deliver the photomask 3 held by the carrier head 35 to the processing module 50 for processing, the transportation stage 40 is first moved to a position as shown in FIG. 7. In the position shown in FIG. 7, the transportation stage 40 is positioned below the carrier head 35. The carrier head 35 and the transportation stage 40 are arranged along the Z axis.

Figure 8:
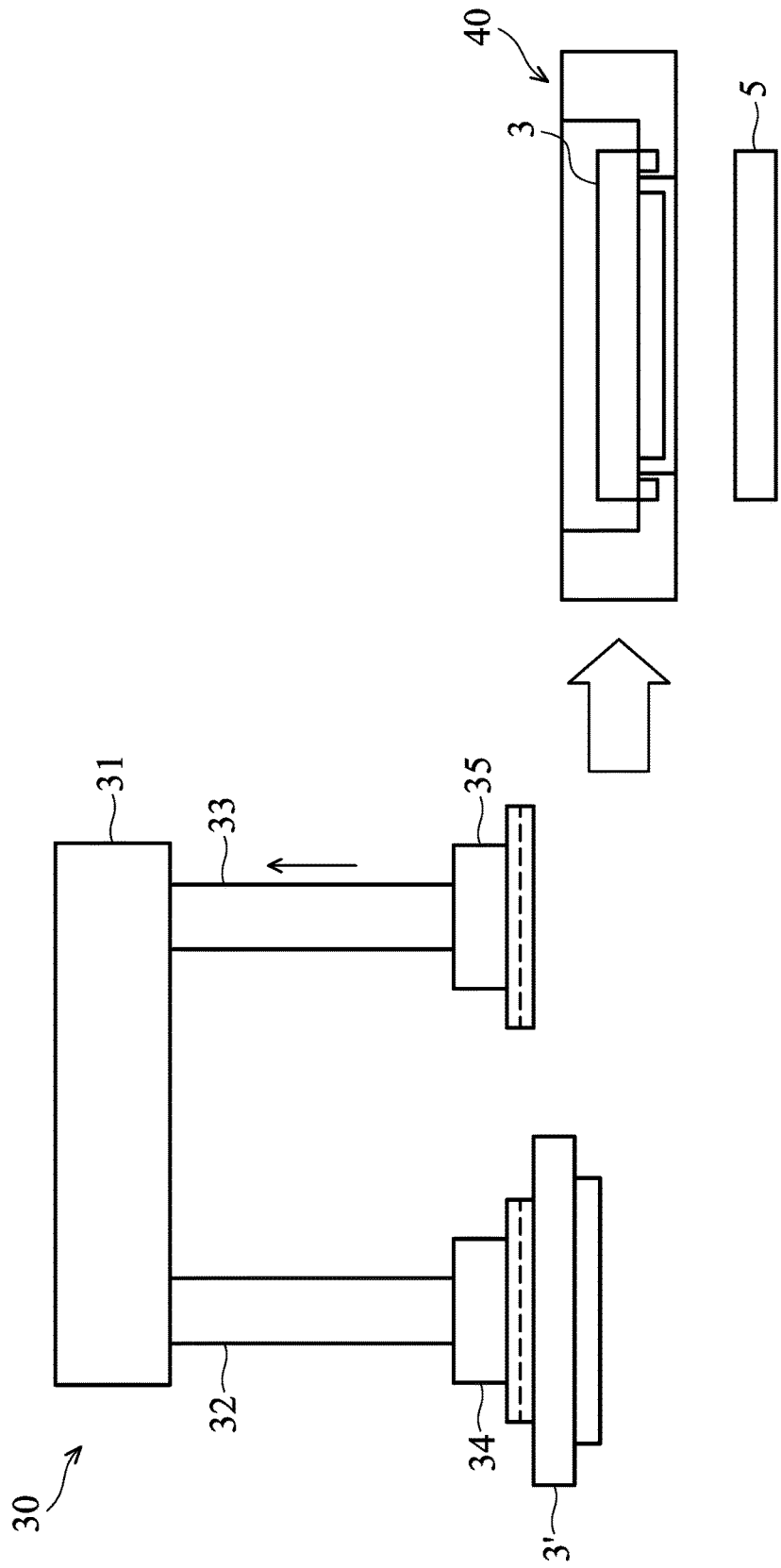
FIG. 8 is a schematic view of one stage of a process for transporting a photomask in a semiconductor wafer processing system as the transportation stage is in a loading position and the photomask is affixed to the transportation stage, in accordance with some embodiments.

Afterwards, the elevator 33 is lowered down, and the photomask 3 held by the carrier head 35 is placed on the transportation stage 40. At this time, the pellicle 303 of the photomask 3 is positioned in the opening 43, and two opposite sides of the substrate 301 of the photomask 3 are affixed to the clamping devices 45. Specifically, two opposite sides of the substrate 301 of the photomask 3 are in direct contact with the membrane 47 of the clamping devices 45 and are attached to the membrane 47 by a vacuum. Afterwards, as shown in FIG. 8, the photomask 3 is released by the carrier head 35, and the elevator 33 lifts up the carrier head 35.

In cases where the processing module 50 utilizes the photomask 3 for processing the semiconductor wafer 5, the photomask 3 is moved into the processing module 50 by the transportation stage 40 and positioned above the semiconductor wafer 5 for the subsequence process. However, it should be appreciated that many variations and modifications can be made to embodiments of the disclosure.

In some embodiments, the photomask 3 on the transportation stage 40 is not used for processing the semiconductor wafer 5. The photomask 3 is delivered to another position in the transportation system 1 or another storage place.

The method continues to operation 82, in which one or more acoustic waves W are generated by the first acoustic transducer 481 and the second acoustic transducer 482 of the clamping devices 45 to force the membrane 47 into a certain mode of oscillation and vibrate at a target resonance frequency.

In some embodiments, while the operation 82 is performed, the transportation stage 40 is moved to an unloading position that is the same as the loading position shown in FIG. 7. Namely, the transportation stage 40 is located below the carrier head 35, and the transportation stage 40 and the carrier head 35 are arranged along the Z axis.

Afterwards, acoustic waves with a particular frequency of about 3 MHz are imparted into the membrane 47 by the first acoustic transducer 481 and the second acoustic transducer 482. The frequency of about 3 MHz for the acoustic waves is provided as an example and it is not intended to be limiting.

Figure 10:
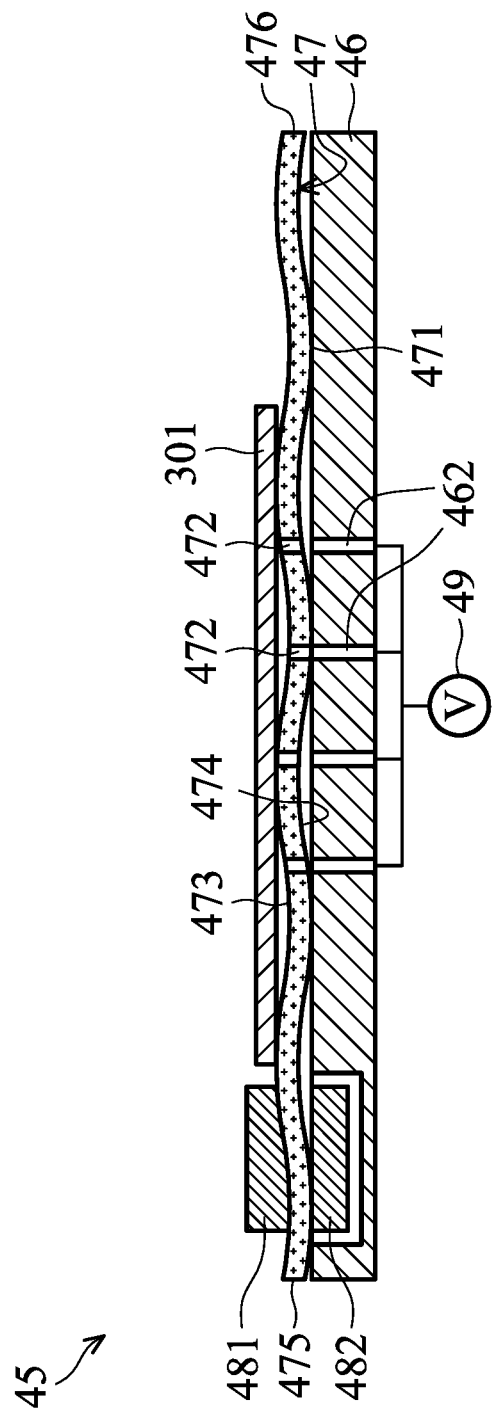
FIG. 10 is cross-sectional view of a clamping device as a Lamb wave is propagated in a membrane of a transportation stage, in accordance with some embodiments.

Compressed by the acoustic waves, zero mode asymmetric Lamb wave (A0), zero mode symmetric Lamb wave (S0), first mode asymmetric Lamb wave, and first mode symmetric Lamb wave are excited in the membrane 47 and the Lamb waves on the membrane 47 exhibit multiple dips as shown in FIG. 10. As a result, the surface roughness of the membrane 47 is increased, and the contact force between the membrane 47 and the photomask 3 is lessened or eliminated.

It should be appreciated that many variations and modifications can be made to embodiments of the disclosure. In some other embodiments, the first mode Lamb waves are not excited by the acoustic waves, but the contact force between the membrane 47 and the photomask 3 can be lessened or eliminated as well.

In some other embodiments, higher mode Lamb waves such as second mode Lamb waves are also excited by the acoustic waves, and the contact force between the membrane 47 and the photomask 3 is lessened or eliminated.

Figure 11:
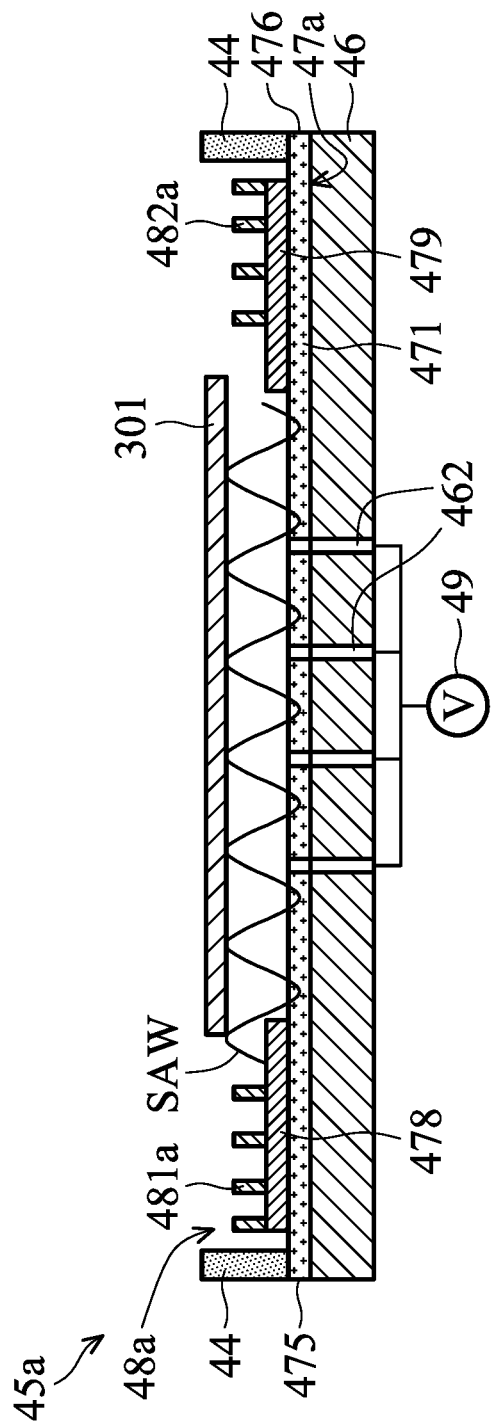
FIG. 11 is cross-sectional view of a clamping device as a surface acoustic wave is propagated in a membrane of a transportation stage, in accordance with some embodiments.

In the embodiments shown in FIGS. 5A and 5B, surface acoustic waves (SAWs) are generated by the first acoustic transducer 481a on the front surface of the membrane 47. As a result, as shown in FIG. 11, the contact force between the membrane 47 and the photomask 3 is lessened or eliminated.

In some other embodiments, surface acoustic waves are generated by both the first acoustic transducer 481a and second acoustic transducer 482a. The surface acoustic waves from the first acoustic transducer 481a and the surface acoustic waves from the second acoustic transducer 482a may be synchronized to other acoustic waves with higher amplitude to eliminate the contact force between the membrane 47 and the photomask 3.

Figure 12:
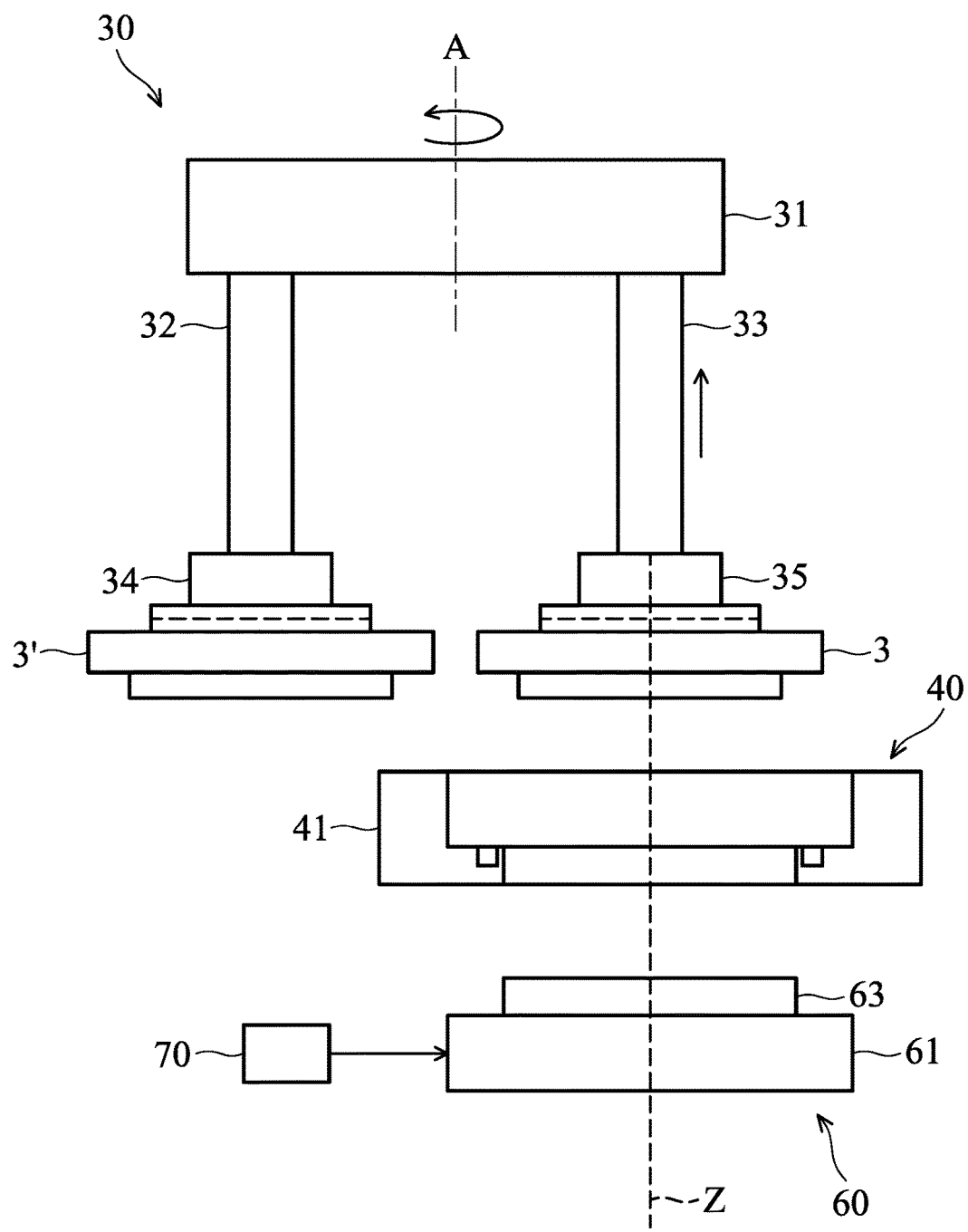
FIG. 12 is a schematic view of one stage of a process for transporting a photomask in a semiconductor wafer processing system as the transportation stage is in an unloading position and the photomask is affixed to the transportation stage, in accordance with some embodiments.

The method continues to operation 83, in which the photomask 3 is removed from the transportation stage 40. In some embodiments, the photomask 3 is removed from the transportation stage 40 by the carrier head 35. Specifically, the carrier head 35 is lowered down by the elevator 33 to enable the gripping of the photomask 3 by the carrier head 35. Afterwards, as shown in FIG. 12, the elevator 33 is lifted up to remove the photomask 3 from the transportation stage 40.

It should be noted that since the contact force generated between the photomask 3 and the membrane 47 of the transportation stage 40 does not remain or weaken, the pull force applied by the elevator 33 to remove the photomask 3 from the transportation stage 40 can be decreased, so that the damage to the membrane 47 of the transportation stage 40 during the removal of the photomask 3 can be prevented or mitigated.

In some embodiments, the photomask 3' held by the carrier head 34 is utilized for the following process after the photomask 3. Therefore, the positions of two carrier heads 34 and 35 are exchanged by rotating the base around the rotation axis A so as to move the photomask 3' over the transportation stage 40. Afterwards, the photomask 3' is manipulated by repeating the operations 81-83. In the meantime, the used photomask 3 is removed from the carrier head 35. If there is another photomask that is going to be used in the following process, the new photomask is gripped by the carrier head 35.

In some embodiments, the contaminant particles would fall on the clamping device 45. The contaminant particles, if not removed, may cause lithography problems such as incorrect focusing, etc. Therefore, it is desirable to remove the contaminant particles from the clamping device 45.

In some embodiments, in order to remove the contaminant particles, acoustic waves are imparted into the membrane 47 during the absence of the photomask 3. The contaminant particles may be removed from the membrane 47 by imparting acoustic waves with different modes of oscillation.

Figure 13C:
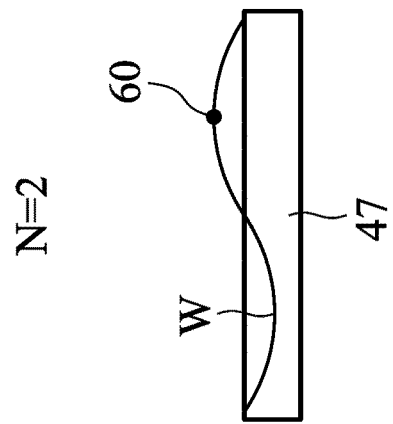
FIG. 13C is a schematic view of one stage of a process for removing particles on a membrane of the transportation stage as acoustic waves force the membrane to bend and vibrate in a second mode of oscillation, in accordance with some embodiments.
Figure 13B:
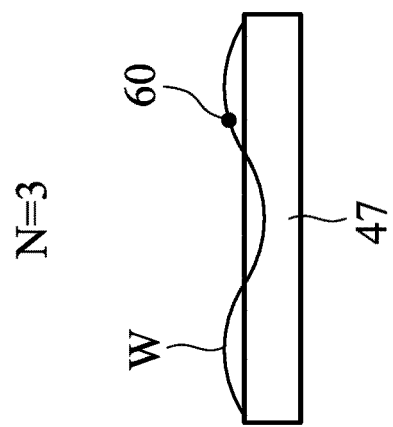
FIG. 13B is a schematic view of one stage of a process for removing particles on a membrane of the transportation stage as acoustic waves force the membrane to bend and vibrate in a third mode of oscillation, in accordance with some embodiments.
Figure 13A:
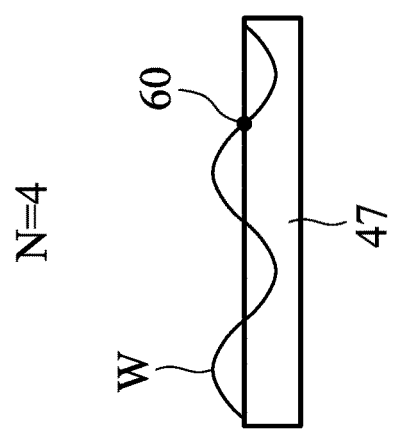
FIG. 13A is a schematic view of one stage of a process for removing particles on a membrane of the transportation stage as acoustic waves force the membrane to bend and vibrate in a fourth mode of oscillation, in accordance with some embodiments.

For example, FIGS. 13A, 13B and 13C illustrate three example modes of oscillation, where N=2 corresponds to a second mode of oscillation, N=3 corresponds to a third mode of oscillation, and N=4 corresponds to a fourth mode of oscillation. By alternating the mode of oscillation, the contaminant particles 60 on the membrane 47 can be removed from the membrane 47 with minimal likelihood of causing damage to the membrane 47 by the acoustic wave W. It should be noted that there may be any other number of modes of oscillation (e.g., N>4), but they are not illustrated herein for reasons of simplicity.

Embodiments of a method and system for transporting photomask use ultrasonic energy to weaken a contact force for affixing the photomask to the transportation stage before the removal of the photomask. Since the applied force for removing the photomask is sufficiently reduced, damage to a membrane of the transportation stage that is in contact with the photomask can be prevented. Therefore, the manufacturing cost is reduced due to expansion of the life span of the clamping device, and the throughput of semiconductor wafers utilized by the photomask for processing is increased because of the increased capacity of the transportation stage. In addition, because particles on the transportation stage are removed by the ultrasonic energy, contamination of the photomask can be avoided or mitigated.

In accordance with some embodiments, a transportation stage for transporting a photomask in a semiconductor fabricating system is provided. The transportation stage includes a vacuum source and a supporting plate. The supporting plate has a number of passages connected to the vacuum source. The transportation stage further includes a membrane. The membrane is positioned on the supporting plate and is divided into a first end portion, a second end portion and a middle region between the first end portion and the second end portion. A number of through holes are formed on the middle region of the membrane and communicating with the passages. The transportation stage also includes a first acoustic wave transducer. The first acoustic wave transducer is positioned on the first end region of the membrane and is configured generate an acoustic wave along the membrane.

In accordance with some embodiments, a method for transporting a photomask by a transportation stage is provided. The method includes placing the photomask on the transportation stage. The transportation stage includes a membrane having a plurality of through holes communicating with a vacuum source, and at least a portion of the photomask is positioned on a membrane relative to the through holes. The method further includes creating a vacuum using the vacuum source to fix the photomask on the transportation stage. The method also includes generating an acoustic wave on a front surface of the membrane that is in contact with the photomask using a first acoustic wave transducer. The first acoustic wave transducer is positioned on the front surface of the membrane. In addition, the method includes removing the photomask from the transportation stage after the acoustic wave is generated.

In accordance with some embodiments, a method for transporting a photomask by a transportation stage is provided. The method includes placing the photomask on the transportation stage. The transportation stage includes a membrane having a plurality of through holes communicating with a vacuum source, and at least a portion of the photomask is positioned on a membrane relative to the through holes. The method further includes creating a vacuum using the vacuum source to fix the photomask on the transportation stage. The method also includes generating a Lamb wave in the membrane by a first acoustic wave transducer that is positioned on the membrane. The first acoustic wave transducer is positioned on the front surface of the membrane. In addition, the method includes removing the photomask from the transportation stage after the lamb wave is generated.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A transportation stage for transporting a photomask in a semiconductor fabricating system, comprising:
   a vacuum source;
   a supporting plate having a plurality of passages connected to the vacuum source;
   a membrane positioned on the supporting plate, wherein the membrane is divided into a first end portion, a second end portion and a middle region between the first end portion and the second end portion, and a plurality of through holes are formed on the middle region of the membrane and communicating with the passages, wherein the first end portion of the membrane comprises a piezoelectric material layer on a front surface which is adapted for contacting the photomask;
   a first acoustic wave transducer positioned on the first end portion of the membrane and is configured to generate an acoustic wave along the membrane, wherein the first acoustic wave transducer comprises two interlocking comb-shaped arrays of metallic electrodes electrically connected to the piezoelectric material layer;

a second acoustic wave transducer positioned on the second end portion of the membrane, wherein the second end portion of the membrane comprises another piezoelectric material layer on the front surface, and the second acoustic wave transducer comprises two interlocking comb-shaped arrays of metallic electrodes electrically connected to the another piezoelectric material; and a feedback circuit electrically connecting the second acoustic wave transducer to the first acoustic wave transducer for transmitting electric signals generated from the second acoustic wave transducer to the first acoustic wave transducer.

2. The transportation stage as claimed in claim 1, wherein the membrane comprises:

a base layer extending from the first end portion through the middle region to the second end portion;

wherein the piezoelectric material layer is positioned on the base layer and corresponds to the first end portion.

3. The transportation stage as claimed in claim 2, wherein the base layer comprises a polymer material.

4. The transportation stage as claimed in claim 1, further comprising an energy absorber disposed on an edge of the membrane.

5. The transportation stage as claimed in claim 1, wherein the first acoustic wave transducer is capable of generating Lamb waves in the membrane.

6. The transportation stage as claimed in claim 1, wherein the membrane comprises a silica glass.

7. The transportation stage as claimed in claim 1, wherein the first acoustic wave transducer is capable of generating surface acoustic waves (SAW) in the membrane.

8. The transportation stage as claimed in claim 1, wherein a length of the first end portion is the same as a length of the second end portion.

9. A method for transporting a photomask by a transportation stage, comprising:

placing the photomask on the transportation stage, wherein the transportation stage comprises a membrane having a plurality of through holes communicating with a vacuum source, and at least a portion of the photomask is positioned on a membrane and corresponds to the through holes;

creating a vacuum using the vacuum source to fix the photomask on the transportation stage;

generating an acoustic wave on a front surface of the membrane that is in contact with the photomask using a first acoustic wave transducer positioned on the front surface of the membrane, wherein the acoustic wave comprises surface acoustic waves (SAW) and the generation of an acoustic wave comprises using the first acoustic wave transducer to convert an electric signal to mechanical forces via a piezoelectric effect;

removing the photomask from the transportation stage after the acoustic wave is generated;

converting the mechanical forces to an electric signal via the piezoelectric effect using a second acoustic wave transducer that is positioned on the membrane;

transmitting the electric signal generated by the second acoustic wave transducer to the first acoustic wave transducer; and using the first acoustic wave transducer to generate another acoustic wave from the electric signal through the use of the electric signal transmitted from the second acoustic wave transducer.

10. The method as claimed in claim 9, wherein the mechanical forces are conveyed by the membrane via a middle region that is in direct contact with the photomask.

11. The method as claimed in claim 10, wherein the through holes are formed on the middle region of the membrane.

12. The method as claimed in claim 9, further comprising absorbing the acoustic wave from the first acoustic wave by an absorber positioned on the membrane when the acoustic wave is transmitted to an edge of the membrane.

13. The method as claimed in claim 9, wherein the second acoustic wave transducer is positioned on the front surface of the membrane.

14. The method as claimed in claim 13, wherein the first acoustic wave transducer and the second acoustic wave transducer are positioned on two sides of the photomask.

15. A method for transporting a photomask by a transportation stage, comprising:

placing the photomask on the transportation stage, wherein the transportation stage comprises a membrane having a plurality of through holes communicating with a vacuum source, and at least a portion of the photomask is positioned on the membrane and corresponds to the through holes;

creating a vacuum using the vacuum source to fix the photomask on the transportation stage;

generating a Lamb wave in the membrane by a first acoustic wave transducer that is positioned on the membrane, wherein the generation of a Lamb wave comprises using the first acoustic wave transducer to convert an electric signal to mechanical forces via a piezoelectric effect;

removing the photomask from the transportation stage after the Lamb wave is generated;

converting the mechanical forces to an electric signal via the piezoelectric effect using a second acoustic wave transducer that is positioned on the membrane;

transmitting the electric signal generated by the second acoustic wave transducer to the first acoustic wave transducer; and using the first acoustic wave transducer to generate another Lamb wave from the electric signal through the use of the electric signal transmitted from the second acoustic wave transducer.

16. The method as claimed in claim 15, wherein the Lamb wave comprises an asymmetric zero-order Lamb wave and a symmetric zero-order Lamb wave propagating in the membrane.

17. The method as claimed in claim 16, wherein the Lamb wave further comprises an asymmetric higher-order mode Lamb wave propagating in the membrane.

18. The method as claimed in claim 15, wherein the mechanical forces are conveyed by the membrane via a middle region that is in direct contact with the photomask.

19. The method as claimed in claim 18, wherein the middle region has a length that is substantially equal to a length of an edge of the photomask that is parallel to a longitudinal direction L of the membrane.

20. The method as claimed in claim 15, wherein the first acoustic wave transducer and the second acoustic wave transducer are positioned on two sides of the photomask.

* * * * *